US009281242B2

(12) United States Patent
Lin

(10) Patent No.: US 9,281,242 B2
(45) Date of Patent: Mar. 8, 2016

(54) THROUGH SILICON VIA STACKED STRUCTURE AND A METHOD OF MANUFACTURING THE SAME

(71) Applicant: Po-Chun Lin, Changhua County (TW)

(72) Inventor: Po-Chun Lin, Changhua County (TW)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 100 days.

(21) Appl. No.: 13/659,928

(22) Filed: Oct. 25, 2012

(65) Prior Publication Data
US 2014/0117556 A1    May 1, 2014

(51) Int. Cl.
| | | |
|---|---|---|
| *H01L 25/065* | (2006.01) | |
| *H01L 21/768* | (2006.01) | |
| *H01L 25/04* | (2014.01) | |
| *H01L 23/48* | (2006.01) | |
| H01L 25/11 | (2006.01) | |
| H01L 25/075 | (2006.01) | |
| H01L 25/07 | (2006.01) | |

(52) U.S. Cl.
CPC ........ *H01L 21/76898* (2013.01); *H01L 23/481* (2013.01); *H01L 25/043* (2013.01); *H01L 25/0657* (2013.01); *H01L 25/074* (2013.01); *H01L 25/0756* (2013.01); *H01L 25/117* (2013.01); *H01L 2225/06513* (2013.01); *H01L 2225/06544* (2013.01); *H01L 2225/06565* (2013.01); *H01L 2225/06593* (2013.01); *H01L 2924/0002* (2013.01)

(58) Field of Classification Search
CPC . H01L 25/043; H01L 25/0657; H01L 25/074; H01L 25/0756; H01L 25/117; H01L 2225/06541; H01L 27/0693; H01L 27/11514; H01L 21/76896; H01L 23/481; H01L 2924/0002; H01L 2225/06513; H01L 2225/06565; H01L 2225/06544; H01L 2225/06593; H01L 2924/00
USPC .......... 257/621, 685, 686, 777, 778, E25.005, 257/E25.013, E25.018, E25.021, E25.027, 257/E23.085, E23.067, E23.174, E21.614
See application file for complete search history.

(56) References Cited

U.S. PATENT DOCUMENTS

| | | | |
|---|---|---|---|
| 6,908,785 B2 | 6/2005 | Kim | |
| 7,838,967 B2 | 11/2010 | Chen | |
| 2003/0137045 A1* | 7/2003 | Sugaya et al. | ................. 257/701 |
| 2005/0230804 A1* | 10/2005 | Tanida | .................. H01L 23/481 257/690 |
| 2005/0287783 A1* | 12/2005 | Kirby et al. | .................... 438/597 |
| 2010/0065949 A1* | 3/2010 | Thies et al. | .................... 257/621 |
| 2010/0200961 A1 | 8/2010 | Chauhan | |
| 2010/0320575 A9* | 12/2010 | Chauhan | ....................... 257/621 |

FOREIGN PATENT DOCUMENTS

| | | |
|---|---|---|
| CN | 1449232 A | 10/2003 |
| CN | 102272916 A | 12/2011 |
| CN | 202275807 U | 6/2012 |
| TW | 201044534 | 12/2010 |

* cited by examiner

*Primary Examiner* — Galina Yushina
(74) *Attorney, Agent, or Firm* — Winston Hsu; Scott Margo

(57) ABSTRACT

A through silicon via (TSV) stacked structure made of stacked substrates. Each substrate includes multiple tapered through silicon vias, wherein the wider end of each tapered through silicon via is provided with a recessed portion and the narrower end of each tapered through silicon via protrudes from the substrate. The substrates are stacked one after another with the narrower end of each tapered through silicon via being fitting and jointing into a corresponding recessed portion of the tapered through silicon via.

7 Claims, 7 Drawing Sheets

THROUGH SILICON VIA STACKED STRUCTURE AND A METHOD OF MANUFACTURING THE SAME

BACKGROUND OF THE INVENTION

1. Field of the Invention

The present invention generally relates to semiconductor technology. More particularly, the present invention relates to a tapered through silicon via stacked structure and a method of manufacturing the same.

2. Description of the Prior Art

In conventional semiconductor chips, ICs are formed on the active surfaces of the semiconductor chips or substrates with conventional electrical terminals, such as bonding pads formed on the active surfaces. In high-density electrical interconnections, 3D chip stacking was developed with electrical terminals not only disposed on the active surfaces but also on the corresponding back surfaces of the semiconductor chips. Through silicon via (TSV) is the technology that enables the vertical stacking of several chips or wafers to assemble 3D chip stacking packages/modules or wafer bonding with high power, high densities, and small dimensions. The TSVs are electrically-conductive through holes inside a chip that penetrate through the top surface and the bottom surface of a chip to create vertical electrical connections without any interposers nor bonding wires. The TSVs provide direct vertical electrical connections that do not go through the sidewalls at the edges of the chips, so as to shorten the electrical paths. The TSVs can further enhance the integration and the performances of an electronic device through greatly reducing the packaging heights and dimensions, in order to increase the speed, and to decrease the power consumption of the electronic device.

In order to connect the TSVs of stacked chips, the TSVs on each chip should be correspondingly aligned to each other. With the trend in the industry towards scaling down the size of circuit structures, the size of the TSV connections is also getting smaller and smaller. Thus, it becomes more difficult to accurately align every TSV on one chip or substrate to the corresponding TSV on another chip or substrate.

In U.S. Pat. No. 6,908,785 Kim discloses a semiconductor chip with TSV structures. In this structure, each semiconductor chip is provided with a plurality of through holes penetrating therethrough. The conductive metals are disposed around each through hole and connected to electrical terminals or circuits on both surfaces of the semiconductor chip. The through holes with conductive metals disposed therearound serve as the TSV structure of this invention. The invention is featured with a plurality of conductive pins pre-disposed on a carrier as vertical electrical connections between the vertically stacked semiconductor chips. However, in order to electrically connect all the semiconductor chips to the carrier, all the conductive pins have to be straight without any bending, deformation, nor shifting and should be accurately aligned and inserted into all corresponding through holes. Once one of the conductive pins or the semiconductor chips is bent, deformed or shifted during the stacking processes, the conductive pins can not be easily inserted into the through holes of the semiconductor chips stacked afterwards. This leads to alignment issues and poor production yields.

In U.S. Pat. No. 7,838,967 Chen discloses a semiconductor chip having TSV structure. The chip is provided with a plurality of bonding pads disposed respectively on both surfaces of the semiconductor substrate with through holes penetrating therethrough. The invention features an extruded ring protruding from each bonding pad. The extruded ring has two proper dimensions which match each other. In stacking processes, the smaller extruded ring of a bonding pad on one substrate is embedded into and encircled by a larger extruded ring of a bonding pad on another substrate. Accordingly, a plurality of semiconductor chips can be stacked to each other with an accurate alignment process. However, using the extruded ring which protrudes from the bonding pad to connect the chips may inevitably increase the assembly height. Also, in the actual stacking practice, it is difficult for a plurality of annular extruded rings with exactly corresponding dimension to be fit in and connected to each other.

Accordingly, an improved TSV stacked structure is still needed in the industry to facilitate the accuracy of the alignment process of stacked chips or substrates, and to improve the connection quality between the TSV structures.

SUMMARY OF THE INVENTION

To improve the above-mentioned drawbacks of the prior art, a novel through silicon via stacked structure and method of manufacturing the same are provided in the present invention. The through silicon via stacked structure of the present invention is featured with a tapered through silicon via structure having a wider recessed portion and a protruding narrower end for the corresponding connection. This design can effectively improve the alignment of stacked substrates and reduce the thickness of the overall stacked structure.

One object of the present invention is to provide a through silicon via stacked structure constructed by a plurality of stacked substrates. Each substrate includes at least one tapered through silicon via penetrating through the substrate. The wider end of tapered through silicon via is provided with a recessed portion exposed from one surface of the substrate, and the narrower end of the tapered through silicon via is protruding from the other surface of the substrate. The substrates are stacked one after another with the narrower end of each tapered through silicon via on one substrate fitting and jointing into a corresponding recessed portion of the tapered through silicon via of another substrate.

Another object of the present invention is to provide a method of manufacturing through silicon via stacked structures comprising the steps of providing a plurality of substrates, forming at least one tapered hole on one surface of each substrate, filling up each tapered hole with a tapered through silicon via, forming a recessed portion on the wider end of each tapered through silicon via, removing a part of the substrate until the narrower end of each tapered through silicon via protrudes from the other surface of the substrate, and stacking the substrates one after another by fitting and jointing the narrower end of each tapered through silicon via on one substrate into a corresponding recessed portion of the tapered through silicon via of another substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
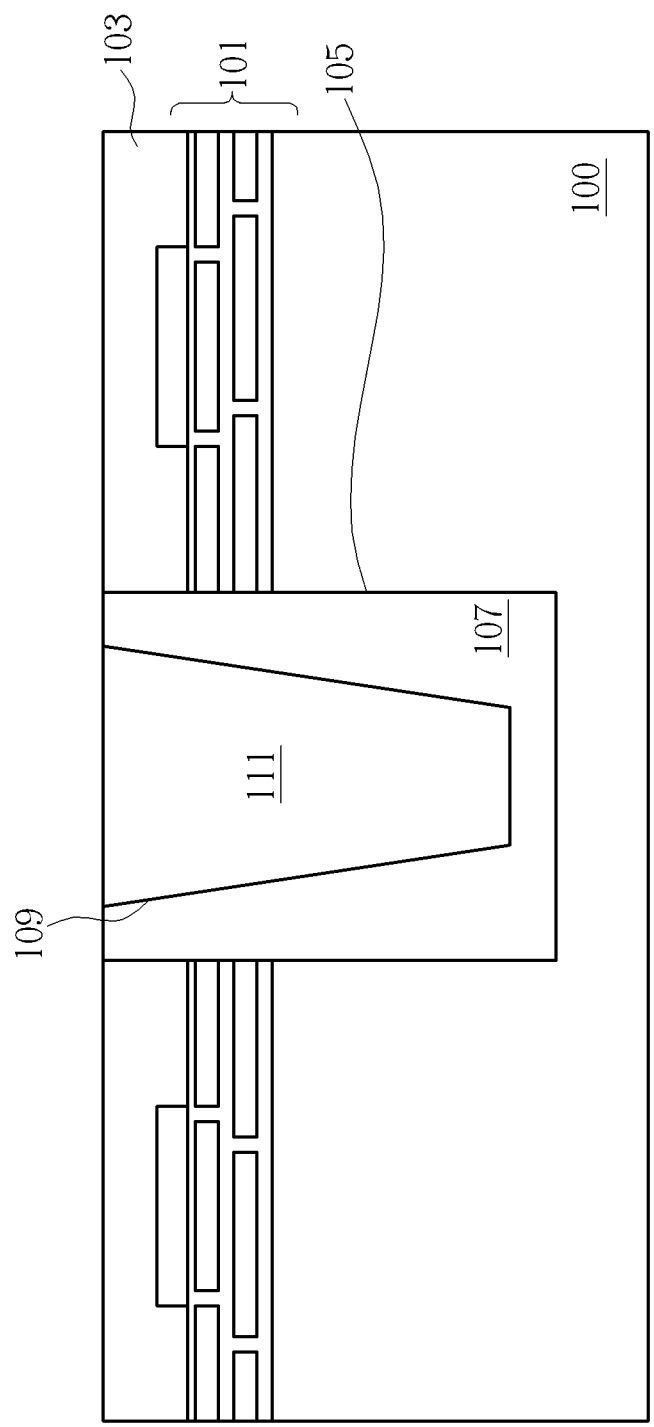
FIGS. 1-7 are cross-sectional views illustrating the process flow of manufacturing a through silicon via stacked structure in accordance with the embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient details to enable those skilled in the art to practice the invention. Other embodiments may be utilized and structural, logical, and electrical changes may be made without departing from the scope of the present invention.

The embodiments will now be explained with reference to the accompanying drawings to provide a better understanding of the process of the present invention. The subject matter of the present invention, i.e. the through silicon via (TSV) stacked structure, is constructed by a plurality of identical or similar substrates stacked one after another by corresponding through silicon vias. To explicitly describe the detailed features and components of the through silicon via stacked structure, the flow of manufacturing one single substrate having through silicon vias is illustrated in FIGS. 1-7.

First, please refer to FIG. 1, the manufacturing flow is started by providing a semiconductor substrate 100 to serve as a base for various semiconductor devices and wiring structures to be formed thereon. In present embodiment, the semiconductor substrate 100 includes, but not limited to, a silicon substrate. In another embodiment, the substrate 100 may be, but not limited to, an epitaxial silicon substrate, a silicon germanium (SiGe) substrate, a silicon carbide (SiC) substrate, or a silicon-on-insulator (SOI) substrate, etc. Multiple circuit layers 101 are formed on one surface (referred hereinafter as the active surface) of the substrate 100. Each circuit layer 101 may include circuit patterns or circuit devices formed therein, such as transistors, capacitor, diodes and/or wirings. A passivation layer 103, such as a polyimide layer, covers the active surface of the substrate 100 to protect the circuit layer 101 from external contamination or damages caused during the manufacturing processes. The substrate 100 with the circuit layer 101 formed thereon may be a semiconductor wafer or a die to be used in a 3D chip assembly/wafer-level packaging (WLP) or wafer bonding process. The substrates 100 will be stacked together and electrically connected in these processes by multiple corresponding through silicon vias (TSV) as the interconnection, to construct an integrated circuit structure.

The manufacture of the aforementioned through silicon via structure will be described later. First, refer again to FIG. 1, at least one via hole 105 is formed at a predetermined position on the active surface of the substrate 100. The via hole 105 extends into the substrate 100, but does not penetrate through the entire thickness of the substrate 100. Thus a wafer backside thinning process may be performed in a later stage to expose the via holes 105 on the other surface (referred hereinafter as the passive surface) of the substrate 100 that is opposite to the active surface. The via holes 105 may be formed by laser drilling process, Bosch deep reactive ion etching process (Bosch DRIE), cryogenic deep reactive ion etching process (Cryogenic DRIE) or wet etching processes (either in isotropic form or anisotropic form).

After the via hole 105 is formed in the substrate 100, the via hole 105 is filled up with a dielectric material 107, such as oxide, nitride or polymer. The dielectric material 107 in this embodiment may serve as a liner or insulator between the substrate 100 and the through silicon via to be formed in following process. After each via hole 105 is filled up with the dielectric material 107, a tapered hole 109 is formed in the dielectric material 107 of each via hole 105. The tapered hole 109 has a wider open end on the active side of the substrate 100 and a narrower closed end extending into the substrate 100. The tapered hole 109 may be formed by using a regular etching process, wherein the resulting sidewall of the tapered hole 109 tends to be slanted inwardly due to the high aspect ratio of the tapered hole 109. By adopting this kind of tapered hole design, the through silicon via with desired tapered shape may be easily obtained in later processes.

After the tapered hole 109 with desired tapered shape is formed in the substrate 100, the tapered hole 109 is filled up with a through silicon via conductor 111. In the present invention, the surface of the through silicon via conductor 111 is leveled with the surface of the dielectric material 107 and the passivation layer 103. The through silicon via conductor 111 may be filled by conventional a plating process or an advanced CVD process with metal materials such as Cu, Al, Ni and/or W. The through silicon via conductor 111 formed inside the tapered hole 109 would have an identical tapered shape as the tapered hole 109.

Figure 2:
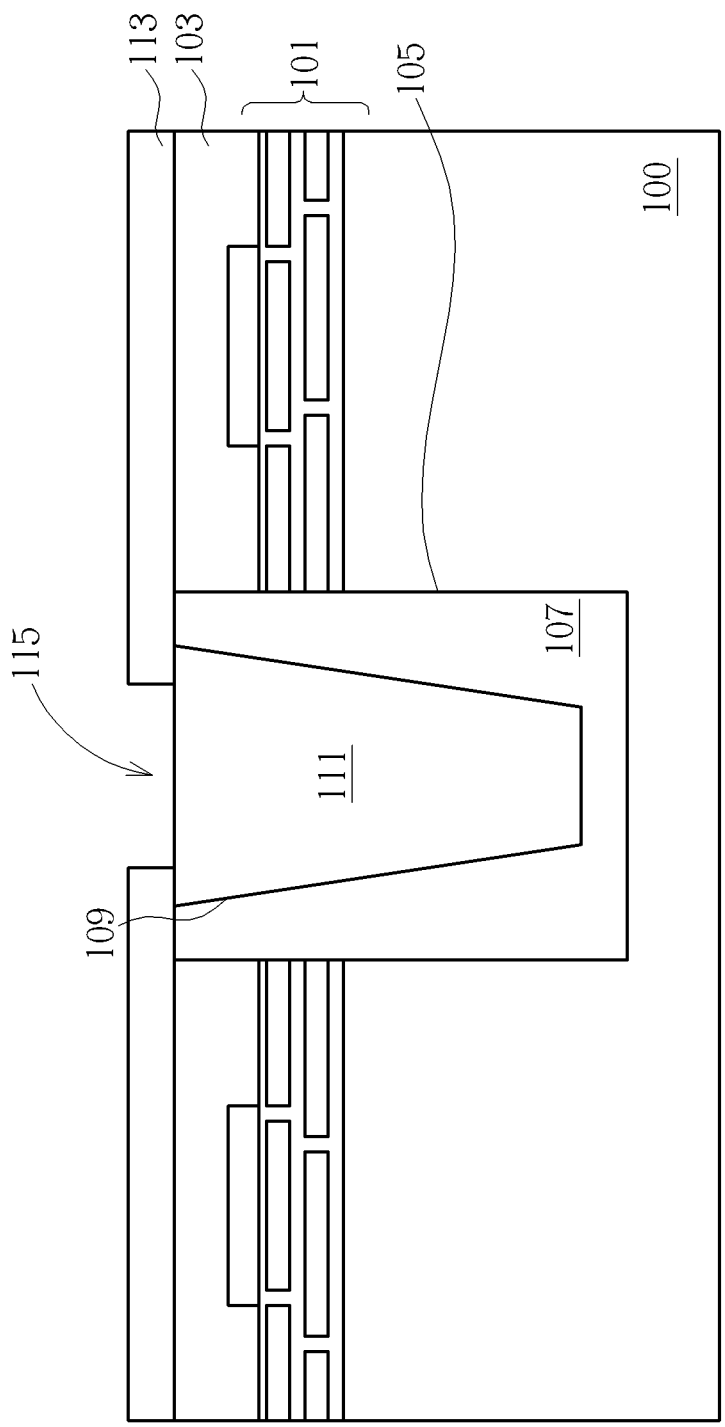

In FIG. 2, after the through silicon via conductor 111 is formed in the substrate 100, a photolithographic process is performed to form a photoresist 113 on the active surface of the substrate 100. The photoresist 113 is provided with an opening 115 that exposes a part of the wider end of the through silicon via conductor 111. Preferably, the opening 115 is formed exactly on the central region of the wider end of the through silicon via 111 and the exposed region of the through silicon via conductor 111 from the photoresist 113 has a circular shape, so that a desired concentric pattern may be formed in the following process.

Figure 3:
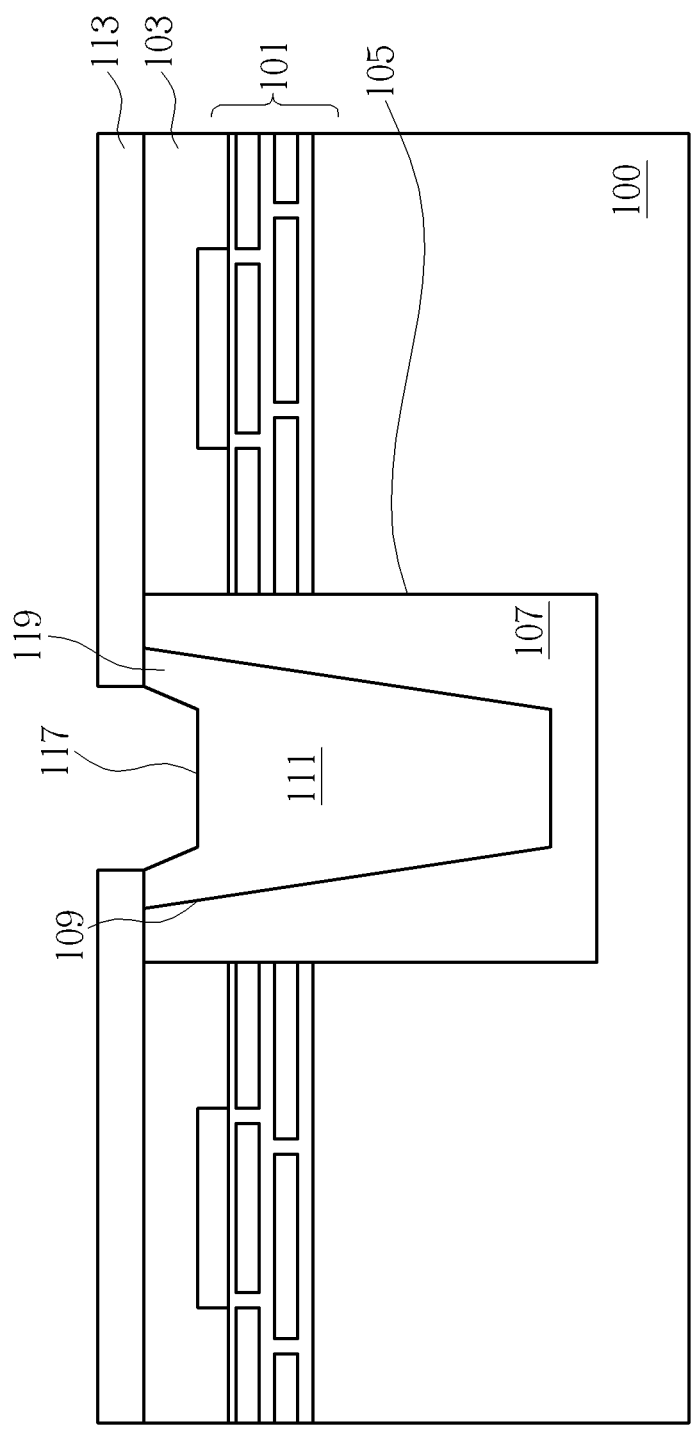

In FIG. 3, after the formation of the photoresist 113 that covers the active surface of the substrate 100, an etching process is performed by using the photoresist 113 as an etching mask to form a recessed portion 117 on the exposed region of the through silicon via conductor 111. Similar to the process of forming the tapered hole 109 shown in FIG. 1, a regular etching process may be adopted to form a tapered recessed portion 117 with desired slanted sidewalls, as shown in FIG. 3. The design of the tapered recessed portion 117 may provide a better fitting and jointing mechanism between the tapered through silicon via conductor 111 in later stacking processes. Preferably, in the present invention, the recessed portion 117 is formed at the center of the exposed region of the through silicon via conductor 111, so that the recessed portion 117 is surrounded by a protruding annular portion 119 which is flush with the surface of the dielectric material 107 and the surrounding passivation layer 103.

Figure 4:
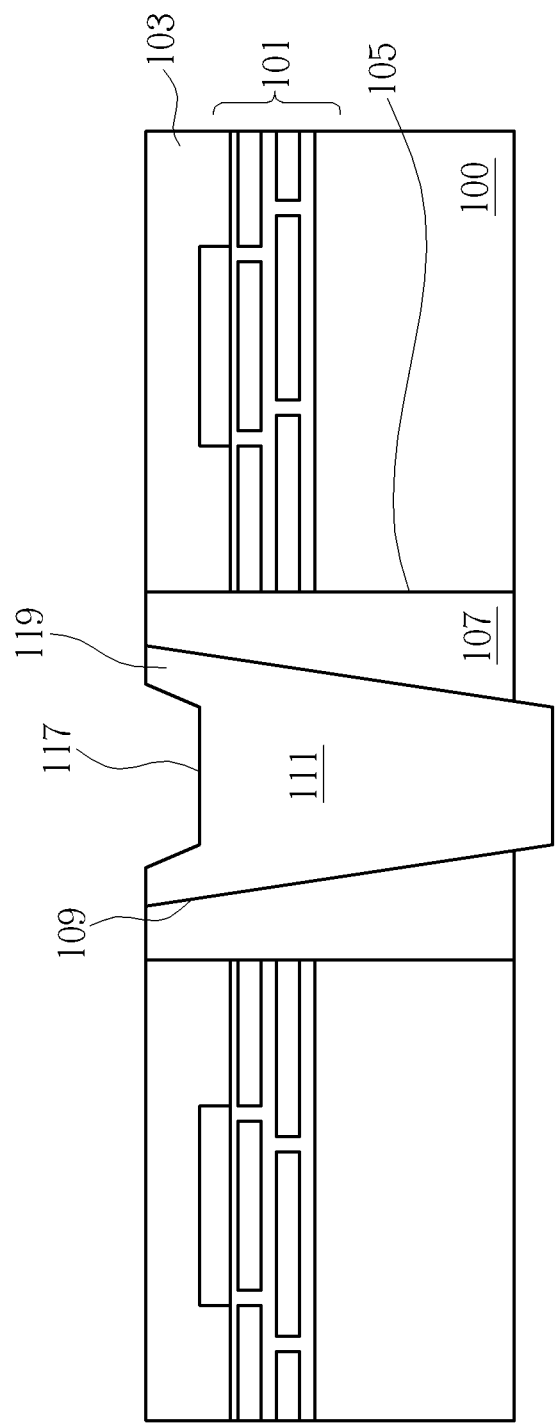

In FIG. 4, after the recessed portion 117 is formed in the through silicon via 111, the photoresist 113 is stripped off from the substrate 100. In this stage, the processes on the active surface of the substrate 100 are completed. On the other hand, refer again to FIG. 4, a selective etching process is performed on the passive surface of the substrate 100 to remove parts of the substrate 100 and the dielectric material 107 until the narrower end 121 of each tapered through silicon via conductor 111 in the substrate 100 protrudes from the passive surface of the substrate 100. The selective etching process in this step may have a significantly higher etching rate to the material of the substrate 100 and the surrounding dielectric material 107, such as Si or SiO$_2$, so that the through silicon via conductor 111 is kept during the etching process while the substrate 100 and the surrounding dielectric material 107 on the same level as the through silicon via conductor 111 are properly removed. Preferably, the protruding narrower end 121 of the through silicon via conductor 111 has an identical tapered shape as the recessed portion 115, and the protruding length of the narrower end 121 is the same as or slightly smaller than the recessed depth of the recessed portion 115, so that the protruding narrower end 121 may be properly fitted into the recessed portion 115 on another substrate 100 in the stacking process. This design may also effectively reduce the thickness of the entire completed stacked structure.

Figure 5:
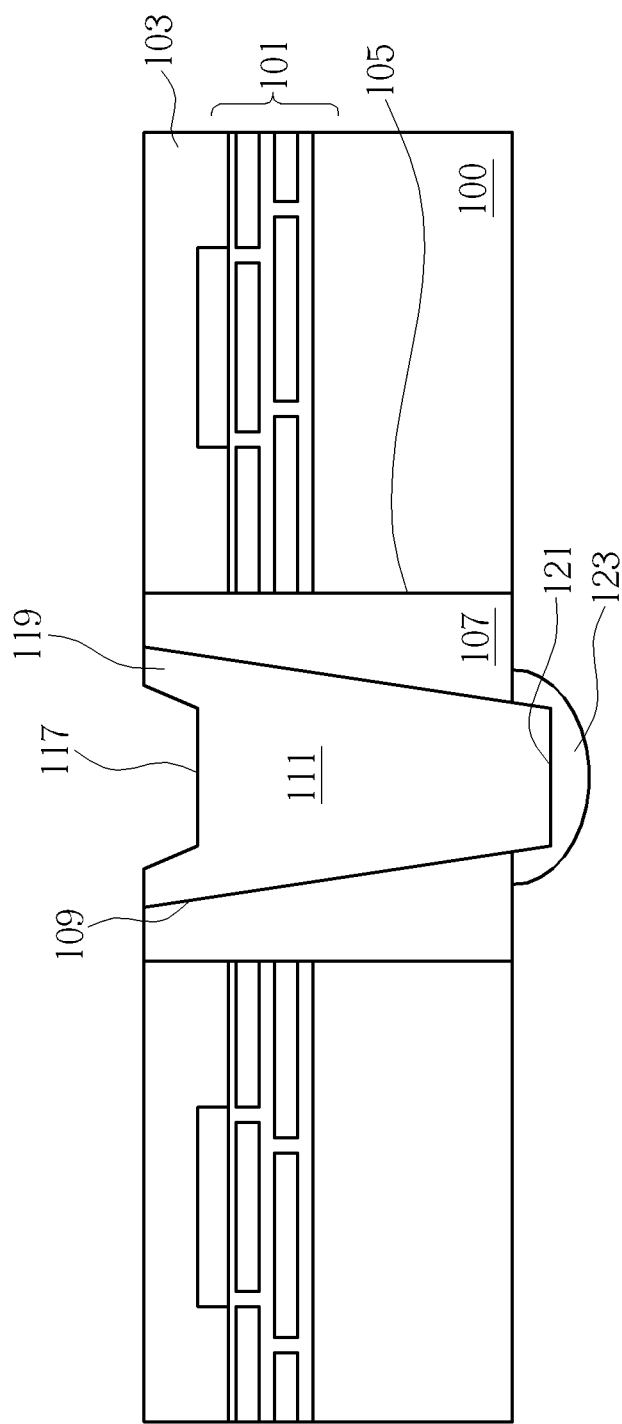

As shown in FIG. 5, in order to further improve the joint between the through silicon via conductors 111, a bump of conductive material 123 may be formed on the protruding narrower end 121 of the through silicon via conductor 111 for filling up the void between the jointed recessed portion 117 and the protruding narrower end 121. The conductive material 123 may be formed by first performing a coating process to cover a photoresist (not shown) on the passive surface of the substrate 100 with an opening exposing the protruding narrower end 121 and the adjacent region. A plating process is then performed to plate the conductive material 123 onto the protruding narrower end 117 through the opening of the photoresist. The material of the conductive material 123 may be selected from the plating Sn, Cu or electroless Sn. Preferably, the coefficient of thermal expansion of the conductive material 123 is chosen smaller than the one of the tapered through silicon via conductor 111, so that the stacked structure may have better stability under frequent thermal cycle. At this stage, the flow of manufacturing one single substrate 100 having a through silicon via conductor 111 is completed.

Figure 6:
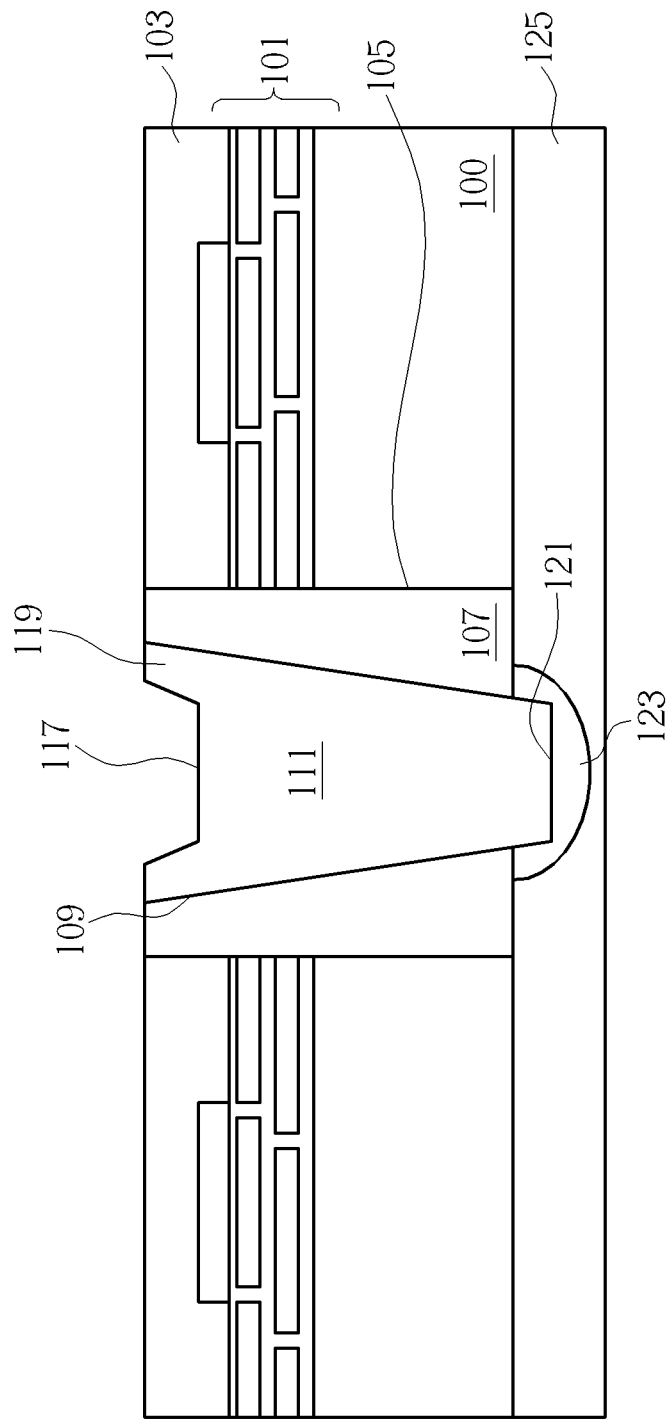

Moreover, as shown in FIG. 6, before the stacking of each prepared substrate 100, the passive surface of the substrate 100 may be further covered with a non-conductive film (NCF) 125. The non-conductive film 125 may cover the entire passive surface of the substrate 100, including the protruding narrower end 121 of the through silicon via 111 and the bump of conductive material 123 formed thereon, to enhance the bonding between the stacked substrates 100. In other embodiments, such as in the application of Chip-on-Glass (COG) process, the non-conductive film (NCF) 125 maybe replaced with an anisotropic conductive film (ACF) to form electrical connections with the circuit on the substrates 100.

Figure 7:
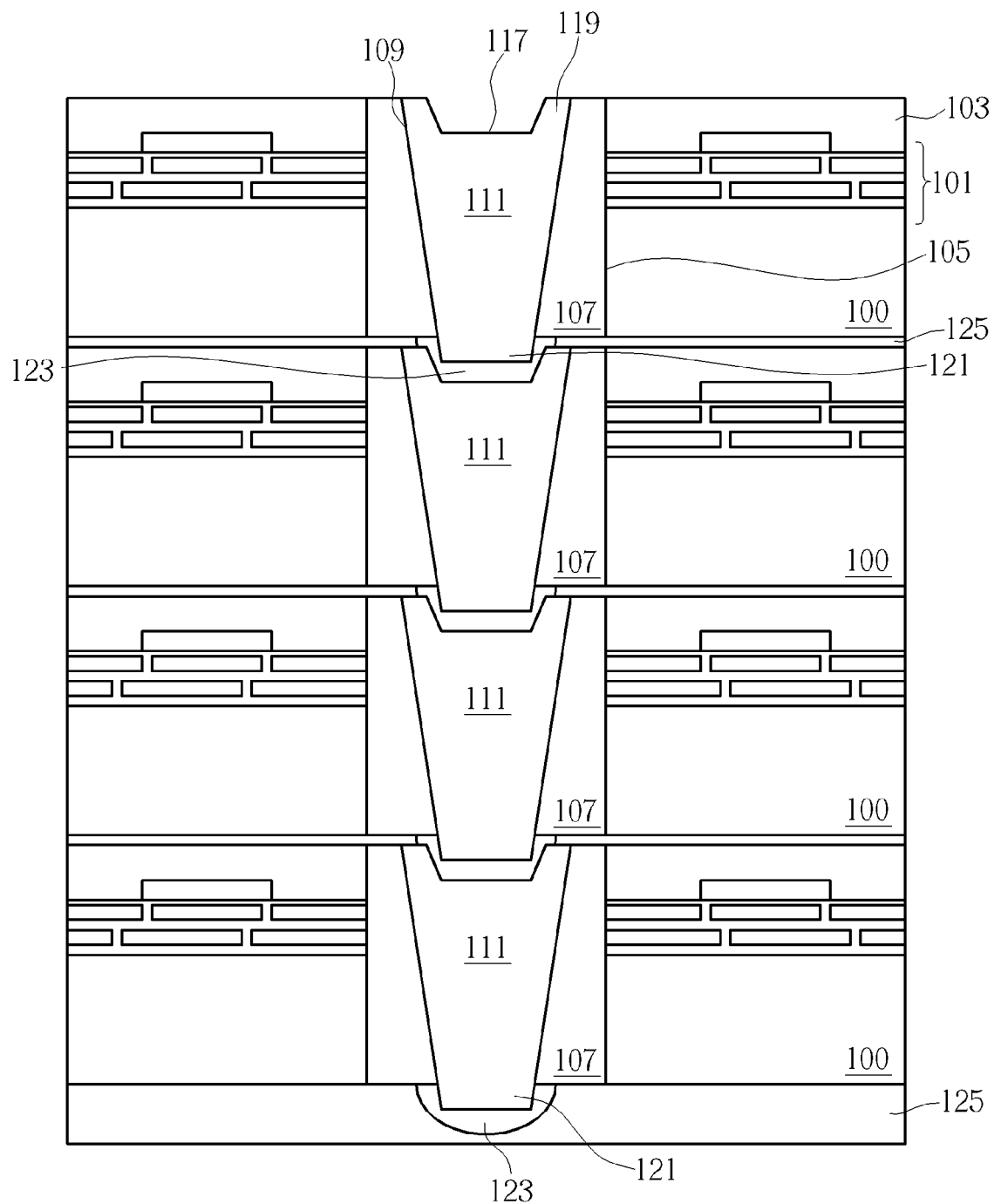

Finally, as shown in FIG. 7, a plurality of substrates 100 are stacked one after another by fitting and jointing the narrower end 121 of each tapered through silicon via 111 on one substrate 100 into a corresponding recessed portion 117 of the tapered through silicon via 111 on another substrate 100. The bump of conductive material 123 fills up the voids between each jointed recessed portion 117 and the narrower end 121 of tapered through silicon via conductor 111. The non-conductive film 125 is intermediate between each stacked substrate 100. The through silicon via stacked structure is therefore completed.

In present invention, the bump of conductive material 123 filling up the voids between each jointed recessed portion 117 and the narrower end 121 of tapered through silicon via conductor 111 can facilitate the joint formation and prevent the formation of air void between the jointed tapered through silicon via conductor 111, thereby improving the conductivity of the through silicon via conductor 111. Furthermore, unlike the conventional approach of through silicon via using additional protruding structures, such as bumps or conductive pin structures for substrate jointing, the joint portions (ex. the recessed portion 117 and the protruding portion 121) between the substrate 100 are formed from the body of the original through silicon via conductor 111. In this manner, the recessed portion 117 are recessed into the tapered through silicon via conductor 111 and the surrounding annular portion 119 is leveled with, rather than protruding from, the surface of the substrate 100, so that the annular portion 119 may have less to hinder the alignment of the substrate 100. The thickness of the overall stacked structures may also be effectively reduced. The particular design of "tapered" through silicon via conductor 111 and "tapered" recessed portion 117 grants the through silicon via conductor 111 of the present invention with corresponding and easy-fitting joint structure, thereby further improving the alignment and the stacking of the substrates 100.

According to the aforementioned process flow of present invention, a through silicon via stacked structure is therefore provided in present invention. As shown in FIG. 5, the substrate 100 includes at least one tapered through silicon via conductor 111 penetrating through the substrate 100. The wider end of the tapered through silicon via conductor 111 is provided with a tapered recessed portion 117 exposed from the active surface of the substrate 100. The recessed portion 117 is surrounded by a protruding annular portion 119 which is flush with the surface of the substrate 100. The narrower end 121 of the tapered through silicon via conductor 111 protrudes from the passive surface of the substrate 100 and is covered by a bump of conductive material 123.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A through silicon via stacked structure, comprising a plurality of stacked substrates, wherein each said substrate comprises:
   at least one tapered through silicon via penetrating through said substrate;
   a dielectric layer between each said through silicon via and said substrate, surrounding said through silicon via, wherein a wider end of said tapered through silicon via comprises a recessed portion exposing from an active surface of said substrate, and wherein a narrower end of said tapered through silicon via protrudes from a passive surface of said substrate that is opposite to the active surface;
   a bump of conductive material encapsulating said narrower end of said tapered through silicon via, wherein said bump of conductive material is in direct contact with said dielectric layer; and
   a material film covering at least a portion of said passive surface of said substrate and being in direct contact with said bump of conductive material;
   wherein said plurality of substrates are stacked one after another with said narrower end of each said tapered through silicon via of one said substrate jointing into a corresponding said recessed portion of said tapered through silicon via of another said substrate.

2. The through silicon via stacked structure according to claim 1, further comprising a conductive material filling up the void between each said jointed recessed portion and said narrower end.

3. The through silicon via stacked structure according to claim 1, further comprising a non-conductive film between each pair of adjacent said stacked substrates.

4. The through silicon via stacked structure according to claim 1, further comprising a passivation layer disposed between each pair of adjacent said stack substrates.

5. The through silicon via stacked structure according to claim 1, wherein said recessed portion has a tapered shape.

6. The through silicon via stacked structure according to claim 1, wherein said material film is a non-conductive film.

7. The through silicon via stacked structure according to claim 1, wherein said material film is an anisotropic conductive film.

* * * * *